(12) United States Patent
Varadan

(10) Patent No.: US 10,746,774 B2
(45) Date of Patent: Aug. 18, 2020

(54) FREESPACE ANTENNA MEASUREMENT SYSTEM

(71) Applicant: Vasundara V. Varadan, State College, PA (US)

(72) Inventor: Vasundara V. Varadan, State College, PA (US)

(73) Assignee: MICROWAVE MEASUREMENT SYSTEMS LLC, State College, PA (US)

( * ) Notice: Subject to any disclaimer, the term of this patent is extended or adjusted under 35 U.S.C. 154(b) by 112 days.

(21) Appl. No.: 16/146,317

(22) Filed: Sep. 28, 2018

(65) Prior Publication Data

US 2019/0379125 A1 Dec. 12, 2019

Related U.S. Application Data

(60) Provisional application No. 62/682,997, filed on Jun. 10, 2018.

(51) Int. Cl.
*H01Q 13/02* (2006.01)
*G01R 29/10* (2006.01)
*H01Q 19/06* (2006.01)
*G01R 29/08* (2006.01)

(52) U.S. Cl.
CPC .......... *G01R 29/10* (2013.01); *G01R 29/0871* (2013.01)

(58) Field of Classification Search
CPC .. G01R 29/10; G01R 29/105; G01R 29/0864; G01R 29/0871; G01R 29/0878; G01R 29/0892; H04B 17/0085; H04W 24/08
See application file for complete search history.

(56) References Cited

U.S. PATENT DOCUMENTS

| 7,791,355 B1 * | 9/2010 | Esher | G01R 29/0871 324/637 |
| 2010/0285753 A1 * | 11/2010 | Foegelle | H04B 17/3911 455/67.12 |

OTHER PUBLICATIONS

R. Simons, "Novel on-wafer radiation pattern measurement technique for MEMS actuator based reconfigurable patch antennas," Tech Rep. NASA/TM-2002-211816, NASA, Nov. 2002.
P. Piksa and P. Cerny, "Near-field measurement of Gaussian beam behind dielectric lens," Radioelektronika 2007. 17th International Conference , Apr. 2007.
T. Brockett, Y. Rahmat-Samii, "A novel portable bipolar near-field measurement system for millimeter-wave antennas: construction, development, and verification," IEEE Antennas and Propagation Magazine, vol. 50, No. 5, pp. 121-130, Oct. 2008.

(Continued)

*Primary Examiner* — Robert Karacsony
(74) *Attorney, Agent, or Firm* — Goodwin Procter LLP

(57) ABSTRACT

Embodiments of the present invention may provide an antenna characterization system. The system may include a horn antenna including a waveguide and a horn section with an open end and at least one lens disposed at the open end of the horn antenna, having a focal length. The system may also include a platform to hold an antenna under test (AUT) positioned at substantially distance x from the open end of the horn antenna, wherein x is the sum of the focal length and a far-field distance property of the AUT. The system may further include an analyzer coupled to the horn antenna to measure a radiation pattern and other properties such as EIRP, TRP, EVR and spurious emission of a passive or active AUT.

20 Claims, 7 Drawing Sheets

(56) References Cited

OTHER PUBLICATIONS

D. K. Ghodgaonkar, V. V. Varadan, V. K. Varadan, "Free-Space measurement of complex permittivity and complex permeability of Magnetic Materials at Microwave Frequencies," IEEE Trans. on Instrumentation and Measurement, vol. 39, No. 2, pp. 387-394, Apr. 1990.

J. Shi, M. A. Cracraft, K. P. Slattery, M. Yamaguchi, and R. E. DuBroff, "Calibration and compensation of near-field scan measurements," IEEE Trans. on Electromagnetic Compatibility, vol. 47, No. 3, pp. 642-650, Aug. 2005.

O. M. Bucci, G. Schirinzi, and G. Leone. "A compensation technique for positioning errors in planar near-field measurements," IEEE Antennas and Propagation Magazine, vol. 36, No. 8, pp. 1167-1172, Aug. 1988.

W. Martin, "Computation of antenna radiation pattern from near-field measurements," IEEE Trans. on Antennas and Propagation, vol. 15, No. 2, pp. 316-318, Mar. 1967.

I. Chen, H. Chiou, and N. Chen, "V-band on-chip dipole-based antenna," IEEE Trans. on Antennas and Propagation, vol. 57, No. 10, pp. 2853-2861, Oct. 2009.

J. A. G. Akkermans, R. van Dijk, and M. H. A. Herben, "Millimber-wave antenna measurement," 2007 European Microwave Conference, pp. 83-86, Oct. 2007, Ref. 910.

R. C. Johnson, H. A. Ecker, and J. S. Hollis, "Determination of far-field antenna patterns from near-field measurements," Proc. IEEE, vol. 61, No. 12, pp. 1668-1694, Dec. 1973, Ref. 11.

A. D. Yaghjian, "Overview of near-field antenna measurements," IEEE Trans. on Antennas and Propagation, vol. 34, No. 1, pp. 30-45, Jan. 1986, Ref.12.

Z. Du, j. l. Moon, S, Oh, J. Koh, and T. K. Sarkar, "Generation of free space radiation patterns from non-anechoic measurements using Chebyshev polynomials," IEEE Trans. on Antennas and Propagation, vol. 58, No. 8, pp. 2785-2790, Aug. 2010.

In Kwang Kim, Disseration submitted in partial fulfillment of requirement for the degree of Doctor of Philosophy in Electrical Engineering, "Design and Implementation of Multiband Antennas Using Metamaterials," University of Arkansas, Aug. 2010.

C. Balanis, "Antenna Theory Analysis and Design," 2nd Ed., pp. i-xvi, Mar. 1997.

\* cited by examiner

FREESPACE ANTENNA MEASUREMENT SYSTEM

RELATED APPLICATION

This application claims priority to U.S. Provisional Application No. 62/682,997 filed Jun. 10, 2018, entitled "Line of Sight Plane Wave Transmitter/Detector Antenna for Complete Active 5G New Radio Characterization in Free Space," the content of which is incorporated by reference herein in its entirety.

FIELD OF THE INVENTION

Embodiments of the present invention are generally related to systems and methods for antenna characterization in freespace employing a plane wave detector for excellent agreement with full wave simulation data and conventional anechoic chamber measurements

BACKGROUND OF THE INVENTION

Wireless communication has become ubiquitous in our society. For instance, 5G, which is the marketing term for the upcoming wireless standard for mobile technologies such as cell phones, promises even faster communication speeds and consequently increasing the amount of information being transmitted wirelessly. To provide these faster speeds, 5G plans to expand its frequency range to the higher bands, e.g., at 26 GHz and above. In addition to cell phones, devices such as automobiles, watches, home appliances, medical devices, etc., now include wireless communication capabilities. To provide wireless communication capabilities, devices must be fitted with appropriate antennas that transmit and/or receive wireless signals at the desired frequency range. Designing those antennas to the desired frequency and performance parameters and obtaining the desired radiation pattern is paramount for effective communication.

In most cases, antennas are tested in anechoic chambers. FIG. 1 illustrates a conventional anechoic chamber 100, which is essentially a large room with RF absorbers 102 on the walls to reduce interference signals. An antenna under test (AUT) 103 will be placed in the chamber along with a measuring or probe antenna. Anechoic chambers suffer from several drawbacks, however. First, they are expensive to construct and maintain due to the fragility of the absorbers. Second, because of the size of the anechoic chambers, they are not transportable to measure antennas in different locations in the supply line, such as the manufacturing plant. Third, conventional large-scale anechoic chambers are not appropriate for measuring radiation patterns for high frequency antennas because the cables from the measuring instruments placed outside the chamber need to be connected to the antennas (the AUT and the measuring antenna) placed inside the chamber. At frequencies above 30 GHz, the attenuation of the signal in long cables reduces the signal to noise ratio considerably, i.e., the signal becomes too weak for effective measurements.

If the AUT is electrically large, to reduce the size of the anechoic chamber, compact ranges may be used. However, compact ranges are also very expensive to construct and maintain, and suffer from the same drawbacks as anechoic chambers.

Accordingly, the inventor recognized a need in the art for an antenna characterization system that provides accurate measurements for broader frequency ranges while also being compact, transportable, and easy to set up.

BRIEF DESCRIPTION OF THE DRAWINGS

In order to facilitate a fuller understanding of the present invention, reference is now made to the accompanying drawings, in which like elements are referenced with like numerals. These drawings should not be construed as limiting the present invention, but are intended to be exemplary only.

DETAILED DESCRIPTION OF THE INVENTION

Figure 1:
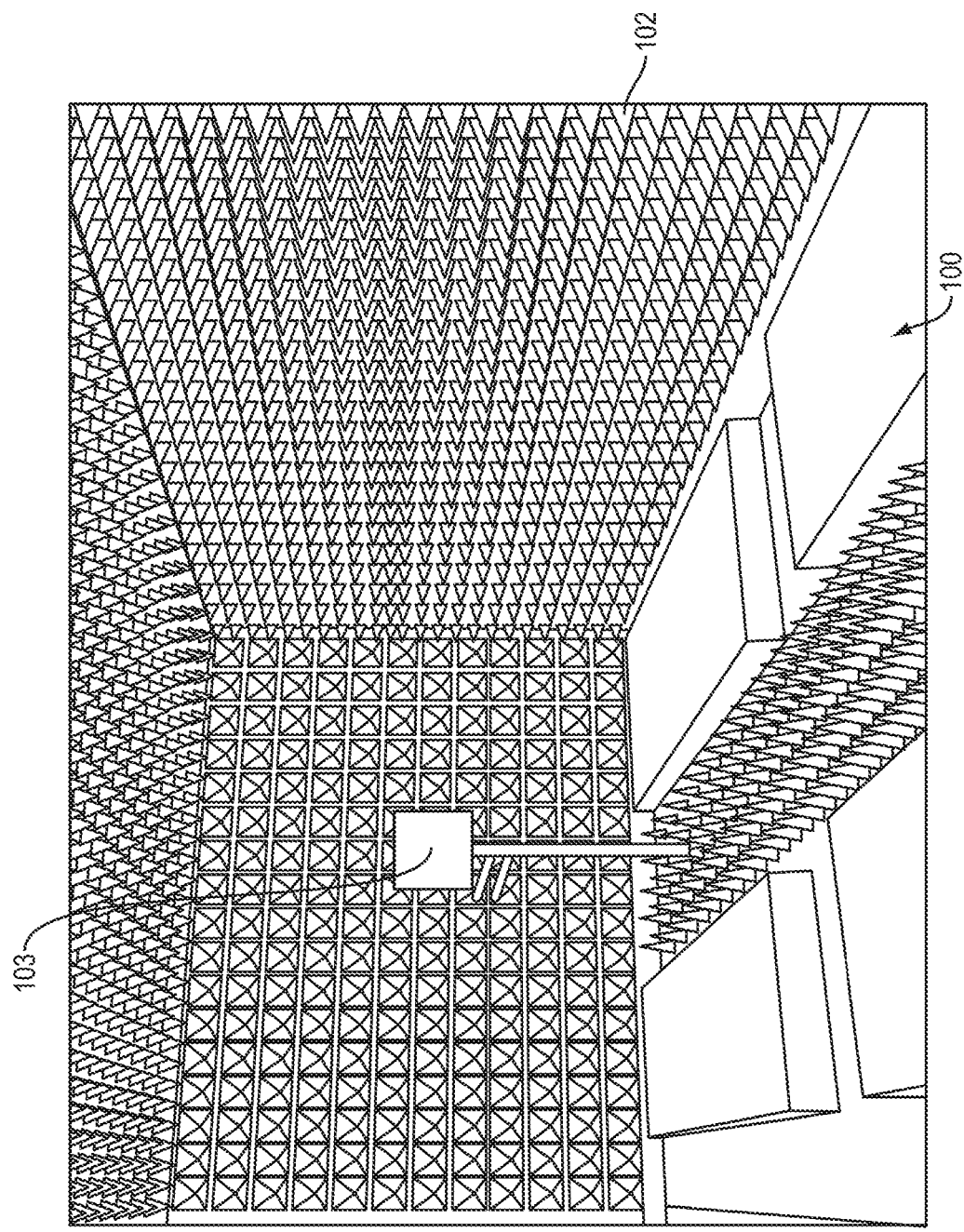
FIG. 1 is a block diagram illustrating an anechoic chamber.

Embodiments of the present invention may provide an antenna mapping system. The system may include a horn antenna including a waveguide and a horn section with an open end and at least one lens disposed at the open end of the horn antenna, having a focal length. The system may also include a platform to hold an antenna under test (AUT) positioned at substantially distance x from the open end of the horn antenna, wherein x is the sum of the focal length and a far-field distance property of the AUT. The system may further include an analyzer coupled to the horn antenna to measure a radiation pattern received by the horn antenna.

Embodiments of the present invention may provide a method to measure a radiation pattern of an antenna under test (AUT). The method may include providing a horn antenna including a waveguide section and a horn section with an open end, wherein at least one lens is located at the open end of the horn antenna, having a focal length; placing the AUT a substantially distance x from the open end of the horn antenna, wherein x is the sum of the focal length and a far-field distance property of the AUT; transmitting a signal from the AUT; receiving the transmitted signal from the AUT at the horn antenna; and measuring a radiation pattern of the AUT based on the received signal from the horn antenna.

Embodiments of the present invention may provide an antenna mapping system. The system may include a plane wave detector having a focal length. The system may also include a platform to hold an antenna, wherein the antenna is located in a light of sight of the plane wave detector at substantially distance x, wherein x is the sum of the focal length and a property of the antenna. The system may further include an analyzer coupled to the plane wave detector to measure a radiation pattern transmitted by the antenna and captured by the plane wave detector.

Embodiment of the present invention disclosed herein are directed to a Freespace Antenna Characterization (or Measurement) System (FAMS) that can operate in free space without need for an anechoic chamber to map the radiation pattern of antennas. The antennas being mapped/tested may operate in a variety of frequency ranges, and may operate in a variety of fields, for example automotive radar and 5G communication systems, military radar, commercial navigation radars, home appliances, etc., to name a few. The FAMS may passively sense the amplitude and phase of the electromagnetic field radiated by a nearby antenna on a spot by spot basis, otherwise called antenna radiation pattern measurement in free space, obviating the need for an expensive anechoic chamber and/or compact range.

In present practice, a probe antenna such as a dipole, wire loop or open waveguide are placed at the spot where the field is to be measured in the anechoic chamber. Such probes, by their presence at the measurement location, disturb the very field they are trying to measure. But, the plane wave detector of the FAMS according to embodiments of the present invention may be placed so that it is physically away from the spot at which it is measuring the amplitude and phase. Hence, no probe corrections are needed.

One particular application of the FAMS disclosed herein may be 5G New Radios, including both handsets and base stations, which operate in or near K band frequencies (26-40 GHz) and present many challenges such as the need for non-contact measurements due to the high frequencies involved. The FAMS embodiments disclosed herein may perform not only antenna pattern measurements, but also make other antenna measurements such as (1) EIRP (Equivalent Isotropic Radiated Power); (2) TRP (Total Radiated Power); (3) EVM (Equivalent Vector Magnitude); (4) Radiation Pattern Measurement in the Near and Far Field; and (5) Spurious Emission. The FAMS embodiments with the use of a plane wave detector may remotely interrogate a planar or curved structure (radomes, aircraft, drones and other objects whose radar cross section if of interest) with a plane wave signal and measure its reflected and transmitted response and hence calculate its microwave material properties and surface characteristics.

Figure 2A:
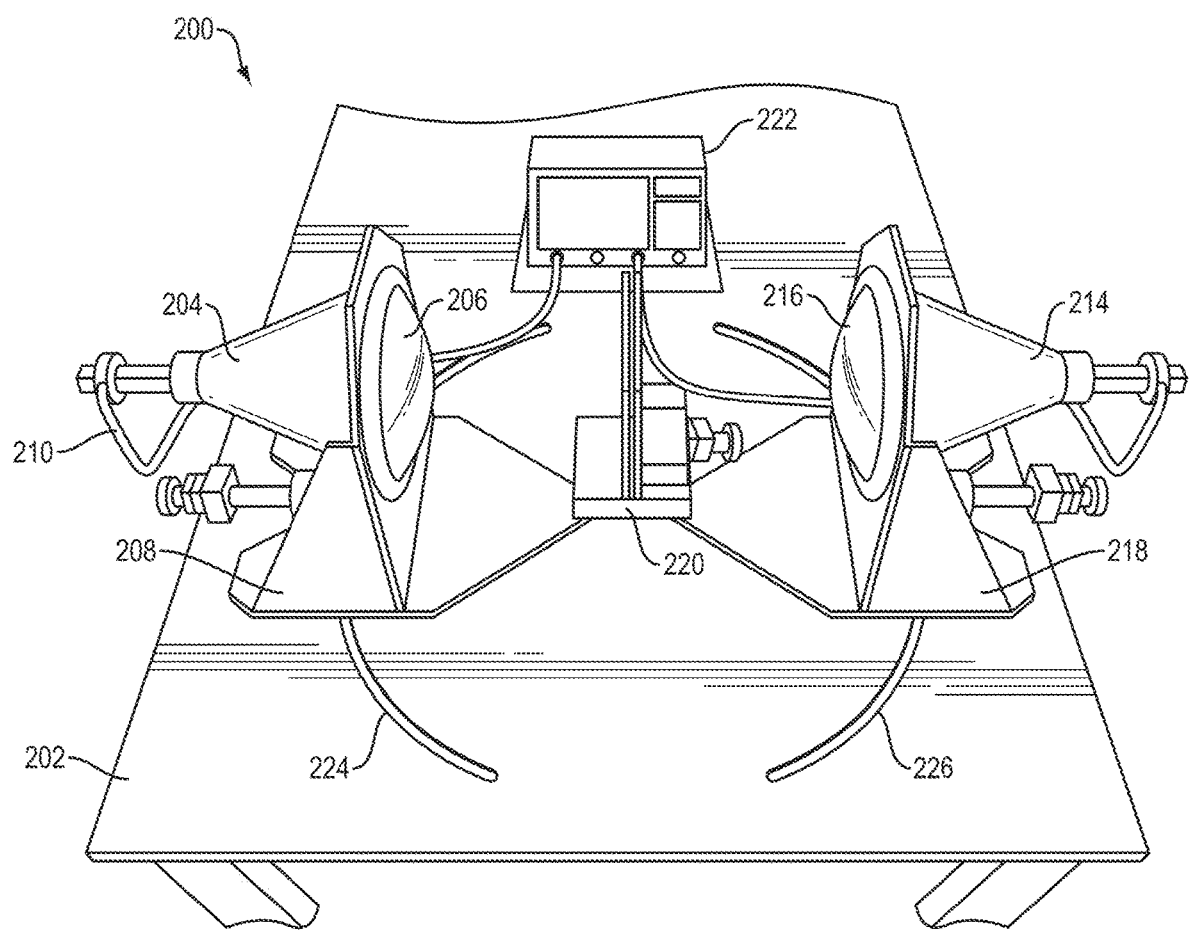
FIG. 2A is a block diagram illustrating a free space measurement system in accordance with an embodiment of the invention.

FIG. 2A illustrates a free space measurement system 200 according to an embodiment of the present invention. The free space measurement system 200 may include a platform 202, a first measuring antenna 204, a first one or more lenses 206, a first support 208, a first cable 210, a second measuring antenna 214, a second one or more lenses 216, a second support 218, a sample holder 220, a vector network analyzer 222, and rotation paths 224 and 226. The free space measurement system 200 may be used to characterize simple to complex materials using microwave frequencies.

The first and second measuring antennas 204, 214 may be provided as two identical plane wave detector/transmitters mounted on a platform 202, such as a table, facing each other. The first and second measuring antennas 204, 214 may be provided as horn antennas, each with a waveguide section and a horn section. One or more lenses 206, 216 may be placed in the horn section of each of the antennas 204, 214. Both antennas 204, 214 may have the capability to transmit and receive. In an arrangement to characterize a material under test, one of the antennas, say antenna 204, may operate as a transmitting antenna that transmits a signal at a predetermined frequency, while the other antenna, say antenna 214, may operate as a receiving antenna that receives the signal transmitted by the transmitting antenna at the predetermined frequency. The antennas 204, 214 may be mounted on the platform 202 with supports 208, 218 along rotation paths 224, 226 so that placement and rotation of the antennas about their axis may be controlled to change, for example, their polarization and about an axis perpendicular to the table to change the angle of incidence.

A sample holder 220, such as a picture frame type holder, may be placed in between the two antennas 204, 214, so that the input plane of an incident wave of the sample face is substantially at one focal length away from the transmitting antenna. The antennas 204, 214 may be connected to a network analyzer 222 with one or more cables 210.

The configuration shown in FIG. 2A may operate as a near perfect plane wave transmitter and receiver. This can be shown with the use of Plexiglass as a sample. First, the system may be calibrated using Thru, Reflect, Line (TRL) calibration establishing a reference for phase and amplitude at the input plane of the sample holder. Next, a planar 120 mm×120 mm piece of Plexiglas that is approximately 1.465 mm thick may be placed in the sample holder and measurements of its S-parameters may be performed. The standard value of the complex permittivity of Plexiglas that is known to be non-dispersive at the measurement frequencies is 2.6+j0.001. It is non-magnetic. For such a planar sample, using the well-known Fresnel formulae for the reflection and transmission of plane waves from an infinite planar slab of Plexiglas of the same thickness as the 120 mm×120 mm experimental sample, the reflection and transmission coefficients can be calculated directly from the Fresnel formulae for an infinite planar slab of thickness 'd', magnetic permeability μ and dielectric permittivity ε for normally incident planewaves:

$$R = r\frac{1 - e^{-j2kd}}{1 - r^2 e^{-j2kd}}$$

$$T = \frac{(1 + r)(1 - r)e^{-jkd}}{1 - r^2 e^{-j2kd}}$$

$$r = \frac{\eta - \eta_0}{\eta + \eta_0}; \eta = \sqrt{\frac{\mu}{\varepsilon}}; \eta_0 = \sqrt{\frac{\mu_0}{\varepsilon_0}} = 120\pi\Omega$$

$$k = 2\pi f\sqrt{\mu\varepsilon}$$

Figure 2B:
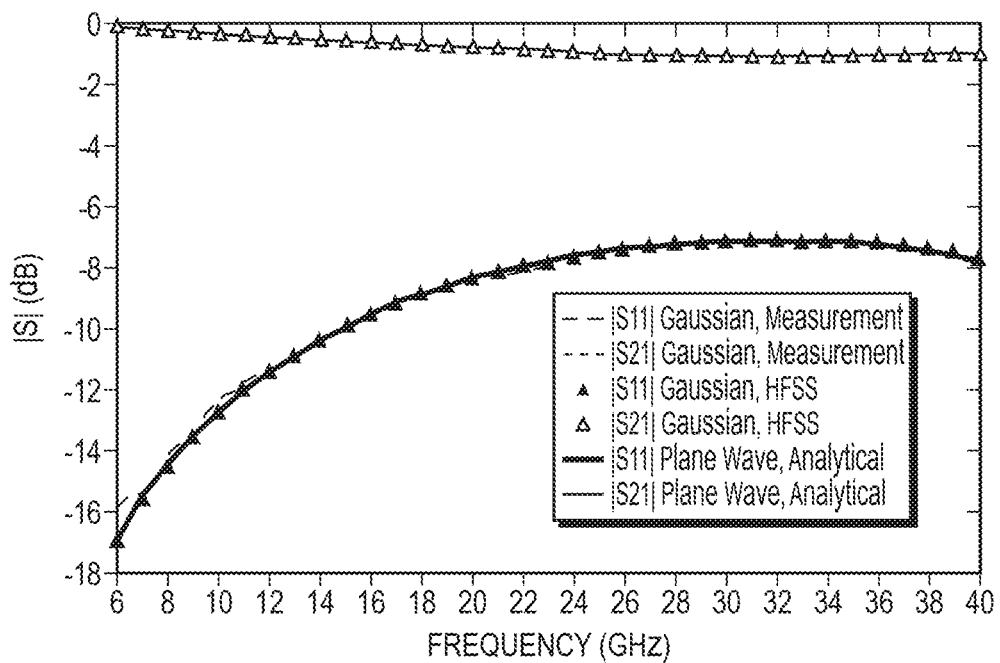
FIG. 2B is a graph illustrating measured amplitude in accordance with an embodiment of the present invention.
Figure 2C:
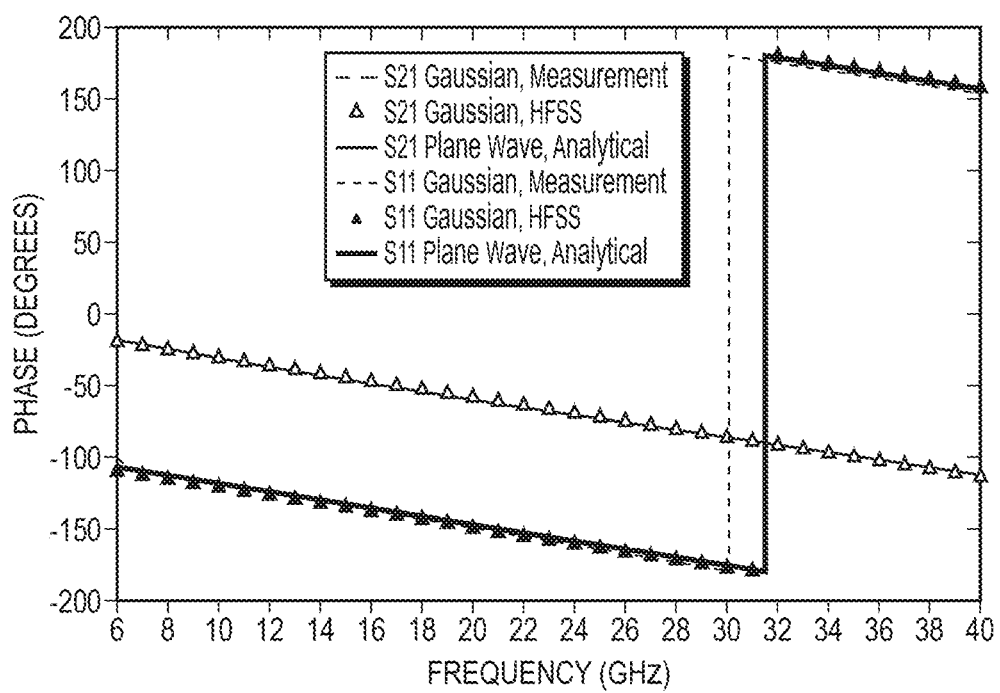
FIG. 2C is a graph illustrating measured phase in accordance with an embodiment of the present invention.

A full wave numerical simulation of the Gaussian beam output by the antenna incident on the actual finite sample may also be simulated. In FIGS. 2B and 2C, the amplitude in dB and phase in degrees of the measured S-parameters are plotted along with the numerically calculated transmission and reflection coefficients on the same scale. Note that all S-parameters, calculated and measured, are normalized to the amplitude of the incident wave and no further scaling is necessary. It can be seen that agreement is near perfect. This shows that focused beam produced by the disclosed horn lens antenna operates as a plane wave transmitter/receiver in the focal spot.

Indeed, since the reflections and transmission coefficients R and T are measurable using the system 200 and the results in FIGS. 2A and 2B, the magnetic permeability and dielectric permittivity of a slab of known thickness 'd' may be extracted by well-known algorithms such as the Weir-Ross algorithm from the Fresnel formulas developed for plane waves. This is because the embodiment is a planewave transmitter and receiver.

Figure 3:
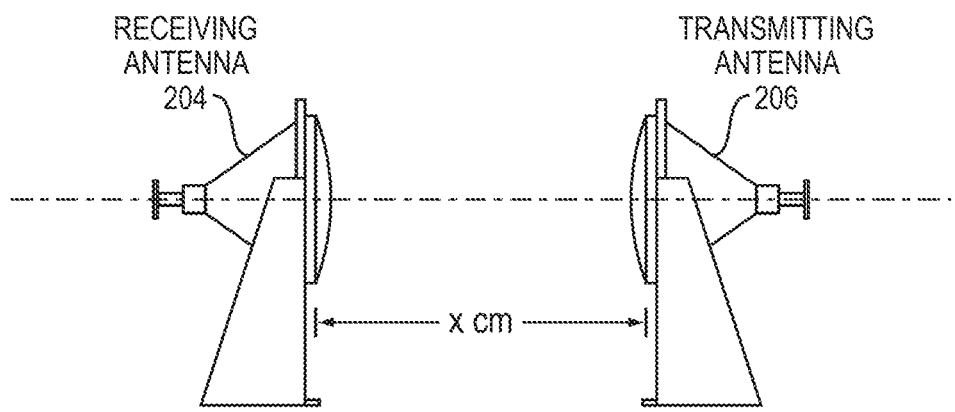
FIG. 3 is a block diagram of a free space measurement arrangement for calibration in accordance with an embodiment of the present invention.

FIG. 3 illustrates a free space measurement system 200 arrangement for calibrating a measurement antenna according to an embodiment of the present invention. Here, the first measuring antenna 204 may be provided as a receiving antenna, and the second measuring antenna 214 may be provided as a transmitting antenna. The two antennas 204, 214 may be placed substantially x distance apart, where x is the sum of the focal length of the two antennas. For example, if each antenna 204, 214 have a focal length of 30 cm, then x would be approximately 60 cm. The transmitting antenna 214 may be coupled to a signal source, such as a network analyzer, and may transmit a calibration signal at a preset frequency. The receiving antenna 204 may receive the transmitted calibration signal. The receiving antenna 204 may be coupled to a network analyzer, which may analyze the received signal. After through response calibration, the ratio of the receiving power to the transmitting power may be measured using the network analyzer. The gain of the measuring antenna may then be calculated. For example, the gain, G, of the measuring antenna may be calculated as follows:

$$\frac{P_r}{P_t} = \left(\frac{\lambda}{4\pi R}\right)^2 G_{0r}, G_0,$$

$$G_{0t} = G_{0r} = G_0$$

where $P_r$ is the received power, $P_t$ is the transmitted power, R is the distance between antennas, and $\lambda$ is the wavelength.

This gain value of the measuring antenna may be stored for use at a later time to adjust antenna mapping measurements of by the measuring antenna as further described in detail below to account for the gain of the measuring antenna.

Figure 4:
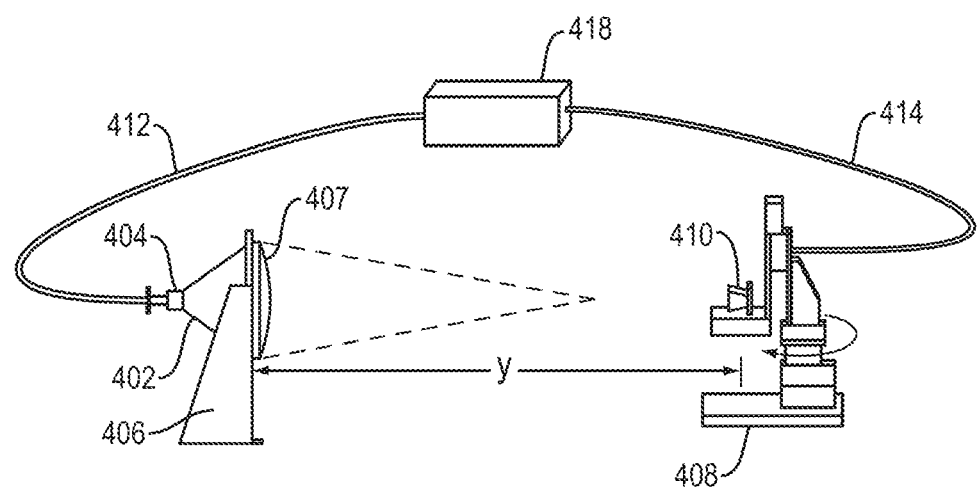
FIG. 4 is a block diagram of a freespace antenna pattern mapping system for a passive antenna under test in accordance with an embodiment of the present invention.

FIG. 4 illustrates a FAMS 400 according to an embodiment of the present invention. The FAMS 400 may include a measuring antenna 402 with an open end 404, a support 406, one or more lenses 407, a measurement platform 408, an antenna under test (AUT) 410, a first cable 412, a second cable 414, a diode power sensor 416, and a network analyzer 418.

The measuring antenna 402 may be provided as a plane wave detector as described above. The measuring antenna 402 may be provided as a horn antenna, with a waveguide section and a horn section. One or more lenses 407 may be placed in the open end of the horn section of the measuring antenna 404. In an embodiment, two convex lenses with the flat surfaces may be abutted against each other along a common axis. The convex lenses may be made of low-loss dielectric material with minimal absorption that is substantially transparent to microwaves. In an embodiment, the lenses may be made of Rexolite. The lenses may have a focal spot that is dependent on the curvature of the lenses.

The measuring antenna may be connected to open end section 404 by way of a tapered transition, a circular to rectangular waveguide transition and a rectangular to coaxial cable transition adjusted to the operational frequency of the antenna. The coaxial cable may be used to couple the measuring antenna 402 to the network analyzer 418.

The measuring antenna 402 may be placed on a surface using support 406, and the measurement platform 408 that holds the AUT 410 may be placed across the measuring antenna 402. In this embodiment, the measuring antenna 402 may be kept stationary using support 406 while the measurement platform 408 may be provided as a rotating platform to rotate the AUT 410 in two axes, for taking measurements in both the horizontal and vertical plane, using a computer controlled mechanism as is known in the art. In another embodiment, for example for measurements on an assembly line, the AUT 410 may be kept stationary while the measuring antenna 404 may be rotated about the AUT 410. In another embodiment, the AUT 410 may be placed on a single-axis rotation platform, where two measurements may be performed. First, the horizontal properties may be measured. Second, the antenna may be turned ninety degrees and the vertical properties may be measured.

The measuring antenna 402 may be placed across the AUT 410 so that the center of the radiating face of the AUT 410 is in the direct horizontal line of sight of the measuring antenna 402. The distance between the measuring antenna 402 and the AUT 410 may be substantially the sum of the focal length of the measuring antenna 402 and a property of the AUT 410, for example the a far-field distance of AUT 410. The far-field distance may be characterized as:

$$2D^2/\lambda,$$

where D is the largest dimension of the antenna and $\lambda$ is the wavelength.

For example, if the measuring antenna 402 has a focal length of 30 cm and the AUT 410 has a far-field distance of 15 cm, then the distance between measuring antenna 402 and the AUT may be set at approximately 45 cm. At smaller distances, the measuring antenna will be in the intermediate and near field range of the AUT. Measurements can also be made in the near-field of the AUT. The measuring antenna 402 may capture the electromagnetic signal at the focal spot, including the amplitude and phase of that signal.

Next, the operations of the antenna mapping 400 is described. The AUT 410 may be provided as a passive antenna; therefore, the AUT 410 may be coupled to the network analyzer 418 via the cable 414 to provide an input signal. The AUT 410 may then transmit the input signal at a desired frequency, and the measuring antenna 402 may receive the transmitted input signal at the focal spot. The measuring antenna 402 may be coupled to the network analyzer 418, which may then calculate the antenna radiation pattern of the AUT 410 and other properties of the AUT 410. The measuring antenna 402 may adjust the calculations based on its own gain, which may be measured at an earlier time according to the procedure described above with reference to FIG. 3.

Figure 5A:
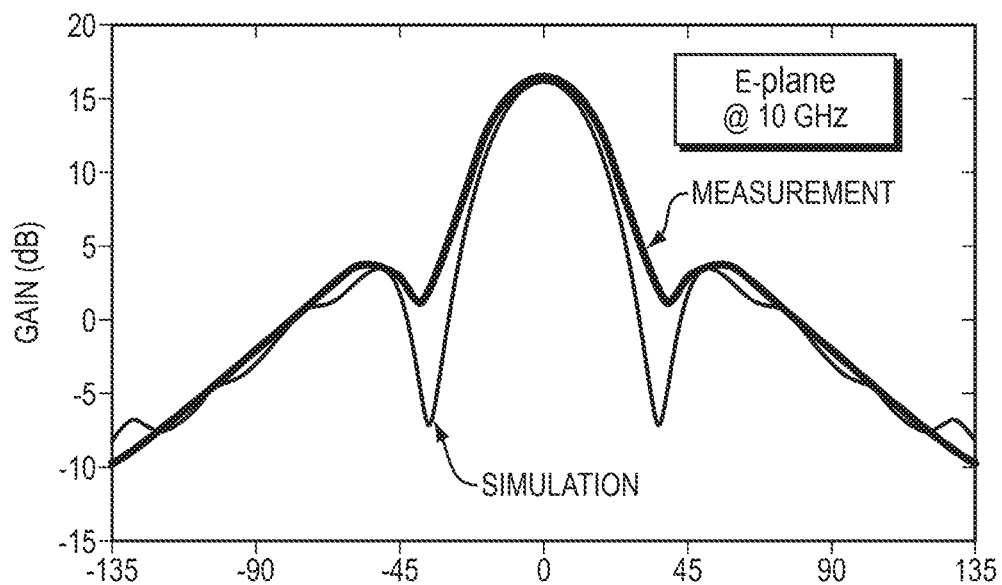
FIG. 5A is a graph illustrating the measured E-plane radiation pattern of an antenna under test in accordance with an embodiment of the present invention.
Figure 5B:
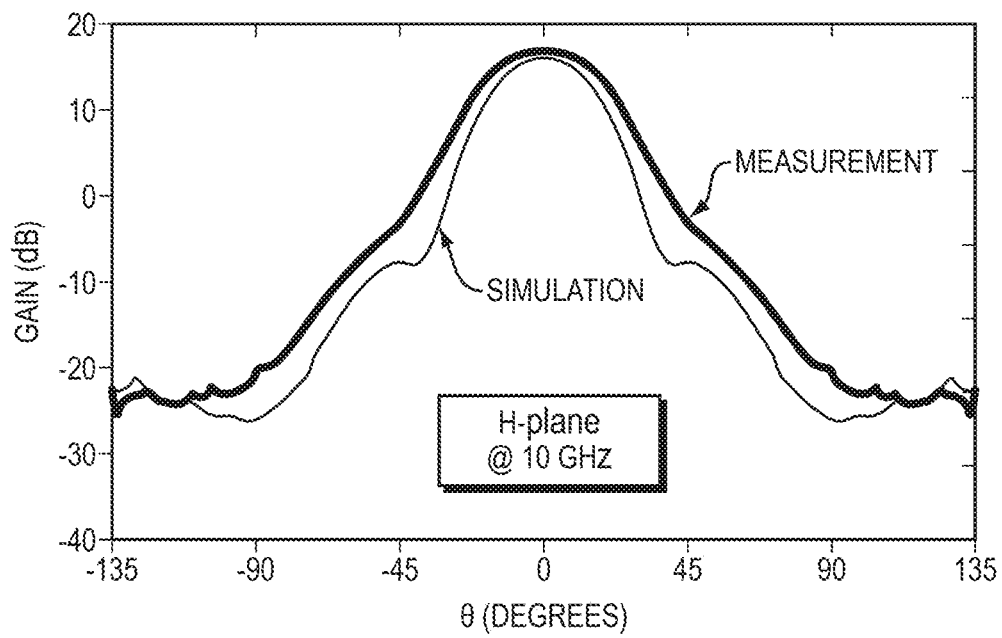
FIG. 5B is a graph illustrating the measured H-plane radiation pattern of an antenna under test in accordance with an embodiment of the present invention.

FIGS. 5A and 5B shows a radiation pattern measured using the antenna mapping system according to embodiments of the present invention (e.g., as described in FIG. 4). FIGS. 5A and 5B shows a radiation pattern measurement as gain in different directions for a X-band (10 GHz) test antenna for both E- and H-plane measurements. The result shows very good agreement with HFSS simulation and show accurate results without using an anechoic chamber.

Figure 6:
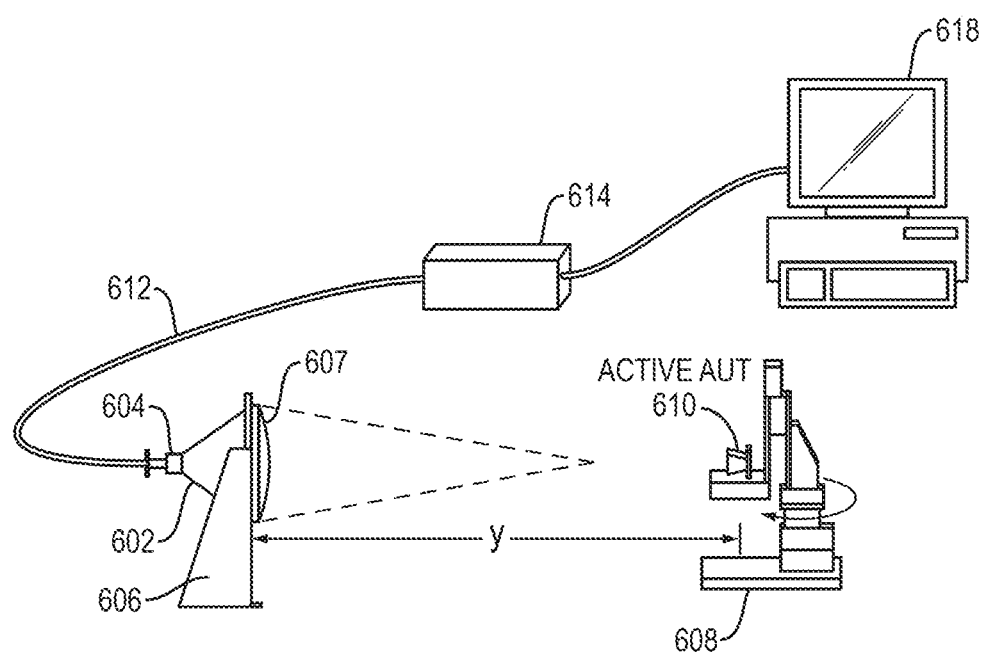
FIG. 6 is a block diagram of a freespace antenna characterization system for an active antenna under test in accordance with an embodiment of the present invention.

In antenna mapping system 400, the AUT 410 was provided as a passive antenna; however, an active antenna may also be measured in accordance with embodiments of the present invention. FIG. 6 illustrates an antenna mapping system 600 for an active AUT according to an embodiment of the present invention. The antenna characterization system 600 may be a measuring antenna 602 with an open end 604, a support 606, one or more lenses 607, a measurement platform 608, an active AUT 610, a cable 612, a power sensor 614, and a computer 618.

The measuring antenna 602 may be provided as a plane wave detector as described above. The measuring antenna 602 may be provided as a horn antenna, with a waveguide section 604 and a horn section. One or more lenses 607 may be placed in the open end of the horn section of the measuring antenna 604. In an embodiment, two convex lenses with the flat surfaces may be abutted against each other along a common axis. The convex lenses may be made of low-loss dielectric material with minimal absorption that is substantially transparent to microwaves. In an embodiment, the lenses may be made of Rexolite. The lenses may have a focal spot that is dependent on the curvature of the lenses.

The measuring antenna may be connected to open end section 404 by way of a tapered transition, a circular to rectangular waveguide transition and a rectangular to coaxial cable transition adjusted to the operational frequency of the antenna. The coaxial cable may be used to couple the measuring antenna 602 to the power sensor 614, which may be connected to a computer 618.

The measuring antenna 602 may be placed across the active AUT 610 so that the center of the radiating face of the active AUT 610 is in the direct horizontal line of sight of the measuring antenna 602. The distance between the measuring antenna 602 and the active AUT 610 may be substantially the sum of the focal length of the measuring antenna 602 and a property of the active AUT 610, for example the far-field distance of the active AUT 610, the calculation of which is described above. For example, if the measuring antenna 602 has a focal length of 30 cm and the active AUT 610 has far-field distance of 15 cm, then the distance between measuring antenna 602 and the active AUT 610 may be set at approximately 45 cm. At smaller distances, the measuring antenna will be in the intermediate and near field range of the AUT. Measurements can be made in the nearfield of the AUT.

In another embodiment, for example for measurements on an assembly line, the active AUT 610 may be kept stationary while the measuring antenna 602 may be rotated about the active AUT 610. In another embodiment, the active AUT 610 may be placed on a single-axis rotation platform, where two measurements may be performed. First, the horizontal properties may be measured. Second, the antenna may be turned ninety degrees and the vertical properties may be measured.

Next, the operations of the antenna characterization system 600 is described. AUT 610, here, is provided as an active antenna with its own power source and signal generation circuit, such as a cell phone, smart watches, laptops, etc.; therefore, the active AUT 610 may provide its own input signal. The active AUT 610 may then transmit a signal, and the measuring antenna 602 may receive the transmitted signal. The measuring antenna 602 may be placed on a 2 axis rotary platform 606, and the 2 axis rotary platform 608 that holds the active AUT 610. In this embodiment, the measuring antenna 602 may rotate synchronously with the active AUT 610 using a computer controlled mechanism as is known in the art.

The measuring antenna 602 may be coupled to a Power Sensor 614 which is connected to the computer 618, which may then calculate various properties of the active AUT 610, including the EIRP of the active AUT 610. The measuring antenna 602 may adjust the calculations based on its own gain, which may be measured according to the procedure described above with reference to FIG. 3.

The FAMS according to embodiments of the present invention may be used to measure various properties of antennas under test. For example, the FAMS according to embodiments of the present invention may measure Equivalent Isotopically Radiated Power (EIRP). The formula for EIRP involves $P_m$, the power measured by 602 using the power sensor for all different angles and the gain $G_m$ of 602 from FIG. 3:

$$EIRP_{AUT}(\theta, \phi) = P_m(\theta, \phi) \cdot \left(\frac{4\pi R}{\lambda}\right)^2 \cdot \frac{1}{G_{mmax}}$$

As another example, the FAMS according to embodiments of the present invention may measure Total Radiated Power (TRP. The TRP is obtained numerically as single number Figure of Merit for the AUT by integrating the EIRP over all measured angles according to:

$$TRP = \frac{1}{4\pi} \int_0^{2\pi} \int_0^{\pi} EIRP(\theta, \phi) \sin\theta d\theta d\phi$$

As another example, the FAMS according to embodiments of the present invention may measure Spurious Emission Measurement (SPR). The AUT is active or self powered and emits a signal. The measuring antenna receives the emitted signal and is connected to a signal analyzer. The signal analyzer can determine whether the AUT is emitting spurious radiation outside the design bandwidth of the AUT and quantify the spurious emission relative to the maximum power radiated by the AUT in a particular direction.

As another example, the FAMS according to embodiments of the present invention may measure Error Vector Magnitude (EVM). This may be measured using an active AUT transmitting actual data as in a real environment of a handset actively transmitting audio or video data modulating the carrier signal. The measuring antenna connected to a Vector Signal Analyzer that can measure the EVM that actually is a measure of the impedance mismatch between the AUT and the radio that powers it. In an embodiment, a spectrum analyzer may be substituted for the Vector Signal Analyzer, and $EVM_{max}$ may be measured.

Several embodiments of the invention are specifically illustrated and/or described herein. However, it will be appreciated that modifications and variations of the invention are covered by the above teachings and within the purview of the appended claims without departing from the spirit and intended scope of the invention.

The invention claimed is:

1. An antenna mapping system, comprising:
a horn antenna including a waveguide and a horn section with an open end;
at least one lens disposed at the open end of the horn antenna, having a focal length;
a platform to hold an antenna under test (AUT) positioned at substantially a distance x from the open end of the horn antenna, wherein x is the sum of the focal length and a far-field distance property of the AUT; and
an analyzer coupled to the horn antenna to measure a radiation pattern received by the horn antenna.

2. The antenna mapping system of claim 1, wherein the at least one lens includes a pair of convex lenses positioned with their flat surfaces against each other and arranged along a common axis.

3. The antenna mapping system of claim 1, wherein the platform is configured to rotate the AUT at least in two dimensions.

4. The antenna mapping system of claim 1, wherein the horn antenna is configured to rotate around the AUT.

5. The antenna mapping system of claim 1, wherein the AUT is a passive antenna and the analyzer provides an input signal for the AUT to transmit.

6. The antenna mapping system of claim 1, wherein the AUT is an active antenna.

7. The antenna mapping system of claim 1, wherein the AUT is a base station antenna.

8. The antenna mapping system of claim 1, wherein the AUT is a handset antenna.

9. The antenna mapping system of claim 1, wherein the AUT is an automotive radar antenna.

10. The antenna mapping system of claim 1, wherein the radiation pattern received from the AUT operates 2 GHz or above.

11. The antenna mapping system of claim 1, wherein the radiation pattern received from the AUT is a plane wave.

12. A method to measure a radiation pattern of an antenna under test (AUT), comprising:
   providing a horn antenna including a waveguide section and a horn section with an open end, wherein at least one lens is located at the open end of the horn antenna, the horn antenna having a focal length;
   placing the AUT substantially a distance x from the open end of the horn antenna, wherein x is the sum of the focal length and a far-field distance property of the AUT;
   transmitting a signal from the AUT;
   receiving the transmitted signal from the AUT at the horn antenna; and
   measuring a radiation pattern of the AUT based on the received signal from the horn antenna.

13. The method of claim 12, further comprising measuring an Equivalent Isotropically Radiated Power of the AUT.

14. The method of claim 12, further comprising measuring a Total Radiated Power of the AUT.

15. The method of claim 12, further comprising measuring spurious emission of the AUT.

16. The method of claim 12, further comprising measuring an Error Vector Magnitude of the AUT.

17. The method of claim 12, wherein the at least one lens includes a pair of convex lenses positioned with their flat surfaces against each other and arranged along a common axis.

18. An antenna measurement system, comprising:
   a plane wave detector having a focal length;
   a platform to hold an antenna, wherein the antenna is located in a line of sight of the plane wave detector at substantially a distance x, wherein x is the sum of the focal length and a property of the antenna; and
   an analyzer coupled to the plane wave detector to measure a radiation pattern transmitted by the antenna and captured by the plane wave detector.

19. The antenna mapping system of claim 18, wherein the plane wave detector comprises a horn antenna and one or more lenses.

20. The antenna mapping system of claim 19, wherein the one or more lenses include a pair of convex lenses positioned with their flat surfaces against each other and arranged along a common axis.

\* \* \* \* \*